(12) United States Patent
Hiramitsu et al.

(10) Patent No.: US 10,892,611 B2
(45) Date of Patent: Jan. 12, 2021

(54) BUS BAR MODULE

(71) Applicants: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

(72) Inventors: Hiroomi Hiramitsu, Yokkaichi (JP); Masato Tsutsuki, Yokkaichi (JP)

(73) Assignees: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 402 days.

(21) Appl. No.: 16/071,975

(22) PCT Filed: Jan. 13, 2017

(86) PCT No.: PCT/JP2017/000981
§ 371 (c)(1),
(2) Date: Jul. 23, 2018

(87) PCT Pub. No.: WO2017/130733
PCT Pub. Date: Aug. 3, 2017

(65) Prior Publication Data
US 2020/0169069 A1    May 28, 2020

(30) Foreign Application Priority Data

Jan. 27, 2016 (JP) ................................ 2016-013483

(51) Int. Cl.
*H02G 3/16* (2006.01)
*B60R 16/02* (2006.01)
(Continued)

(52) U.S. Cl.
CPC ............... *H02G 3/16* (2013.01); *B60R 16/02* (2013.01); *H01M 2/20* (2013.01); *H01R 4/58* (2013.01); *H05K 7/06* (2013.01)

(58) Field of Classification Search
CPC ........ B60R 16/02; B60R 16/023; H02G 3/16; H02G 5/10; H02G 5/06; H02G 5/066; H01M 2/20; H05K 7/06; H01R 4/58
See application file for complete search history.

(56) References Cited

U.S. PATENT DOCUMENTS

| 4,804,804 A * | 2/1989 | Hibbert | H02G 5/007 |
| | | | 138/162 |
| 2009/0178824 A1* | 7/2009 | Burguera | H02G 5/06 |
| | | | 174/68.2 |
| 2014/0144668 A1* | 5/2014 | Walgenbach | H02G 5/10 |
| | | | 174/68.2 |

FOREIGN PATENT DOCUMENTS

| JP | H09233649 A | 9/1997 |
| JP | 2002280090 A | 9/2002 |
| JP | 2014030331 A | 2/2014 |

OTHER PUBLICATIONS

International Search Report and Written Opinion for Application No. PCT/JP2017/000981 dated Feb. 28, 2017; 4 pages.

* cited by examiner

*Primary Examiner* — Timothy J Thompson
*Assistant Examiner* — Amol H Patel
(74) *Attorney, Agent, or Firm* — Reising Ethington, P.C.

(57) ABSTRACT

A bus bar module includes a bus bar that is formed of a plate-shaped piece of metal, a thermally conductive sheet that is in close contact with an outer periphery of the bus bar and that has an extension portion extending outward from the bus bar, and an insulating case that covers the bus bar and the thermally conductive sheet. An accommodation space S (Continued)

in which the extension portion is accommodated with a gap left between the extension portion and the bus bar is provided between the bus bar and the case. Through holes through which the accommodation space S is in communication with an external space are formed penetrating the case.

4 Claims, 19 Drawing Sheets

(51) Int. Cl.
*H01R 4/58* (2006.01)
*H05K 7/06* (2006.01)
*H01M 2/20* (2006.01)

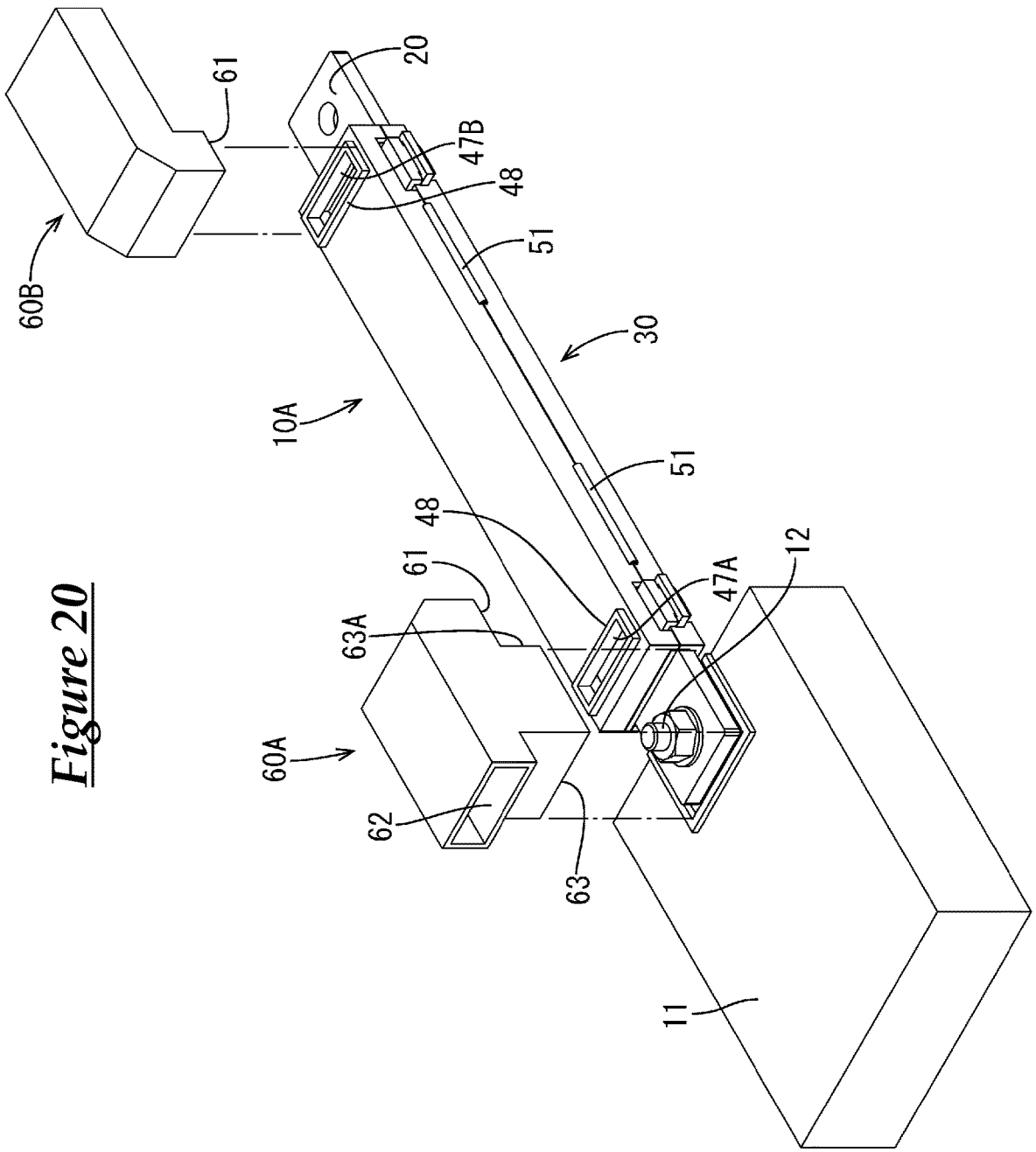

BUS BAR MODULE

CROSS REFERENCE TO RELATED APPLICATIONS

This application claims the priority of Japanese patent application JP2016-013483 filed on Jan. 27, 2016, the entire contents of which are incorporated herein.

TECHNICAL FIELD

This specification discloses technology related to a bus bar module.

BACKGROUND ART

Bus bars installed in vehicles such as electric automobiles and hybrid vehicles are generally covered by an insulating case for the purpose of insulation from the outside, because a relatively large current flows through such bus bars. Patent Document 1 (JP2002-280090A) listed below discloses a configuration in which a bus bar made of metal penetrates a holder made of an insulating synthetic resin, and an insulating potting agent is injected into and cured in a gap within the holder.

SUMMARY

If a configuration is adopted in which a potting agent is injected into a gap within a holder as disclosed in Patent Document 1, not only the materials and steps for potting increase the cost, but also it is not easy to disassemble the manufactured bus bar module. On the other hand, if a configuration is adopted in which the potting agent is not injected, due to the gap between the holder and the bus bar, when the bus bar is energized, the heat of the bus bar is transferred to air in the gap between the holder and the bus bar. In this case, a problem arises in that since the bus bar module does not have a configuration for releasing the heat from the air within the holder to the outside, the heat accumulates within the holder, resulting in poor heat dissipation properties.

The technology described in this specification was made based on circumstances such as those described above, and it is an object thereof to improve heat dissipation properties of a bus bar module.

A bus bar module described in this specification includes a bus bar that is formed of a plate-shaped piece of metal, a thermally conductive sheet that is in close contact with an outer periphery of the bus bar and that has an extension portion extending outward from the bus bar, and an insulating case that covers the bus bar and the thermally conductive sheet. An accommodation space in which the extension portion is accommodated with a gap left between the extension portion and the bus bar is provided between the bus bar and the case, and a through hole through which the accommodation space is in communication with an external space is formed penetrating the case.

According to this configuration, heat that is generated when the bus bar is energized is transferred to the thermally conductive sheet, which is in close contact with the outer periphery of the bus bar. The heat that has been transferred to the thermally conductive sheet is transferred to the air in the accommodation space from the extension portion, and the temperature of the air within the accommodation space increases. The heat of the air within the accommodation space is transferred to air in the external space via the through hole, and the temperature of the air within the accommodation space decreases. Thus, the heat of the bus bar can be dissipated without accumulating within the case, and the heat dissipation properties of the bus bar module can therefore be improved.

The following embodiments are preferred as embodiments of the technology described in this specification.

The case may include a partition portion that separates the bus bar and the extension portion from each other.

With this configuration, displacement of the bus bar can be suppressed by the partition portion.

The through hole may be provided in a region of the case that is different from a region of the case that covers the extension portion.

With this configuration, a worker or the like can be kept from touching the extension portion from the through hole.

The bus bar module may further include a duct in which a vent hole that is in communication with the through hole is formed, wherein an insertion hole in which a shank portion of a bolt or a bolt-shaped terminal can be inserted may be formed penetrating the bus bar, and the duct may be attached so as to cover the bolt or the terminal.

With this configuration, it is possible to make it less likely that a worker or the like will touch a portion where the bus bar is fastened, using the duct provided for heat dissipation.

According to the technology described in this specification, it is possible to improve heat dissipation properties of a bus bar module.

BRIEF DESCRIPTION OF DRAWINGS

FIG. 20 is a perspective view for explaining how the ducts are attached from the state in FIG. 19.

DESCRIPTION OF EMBODIMENTS

Embodiment 1

Figure 1:
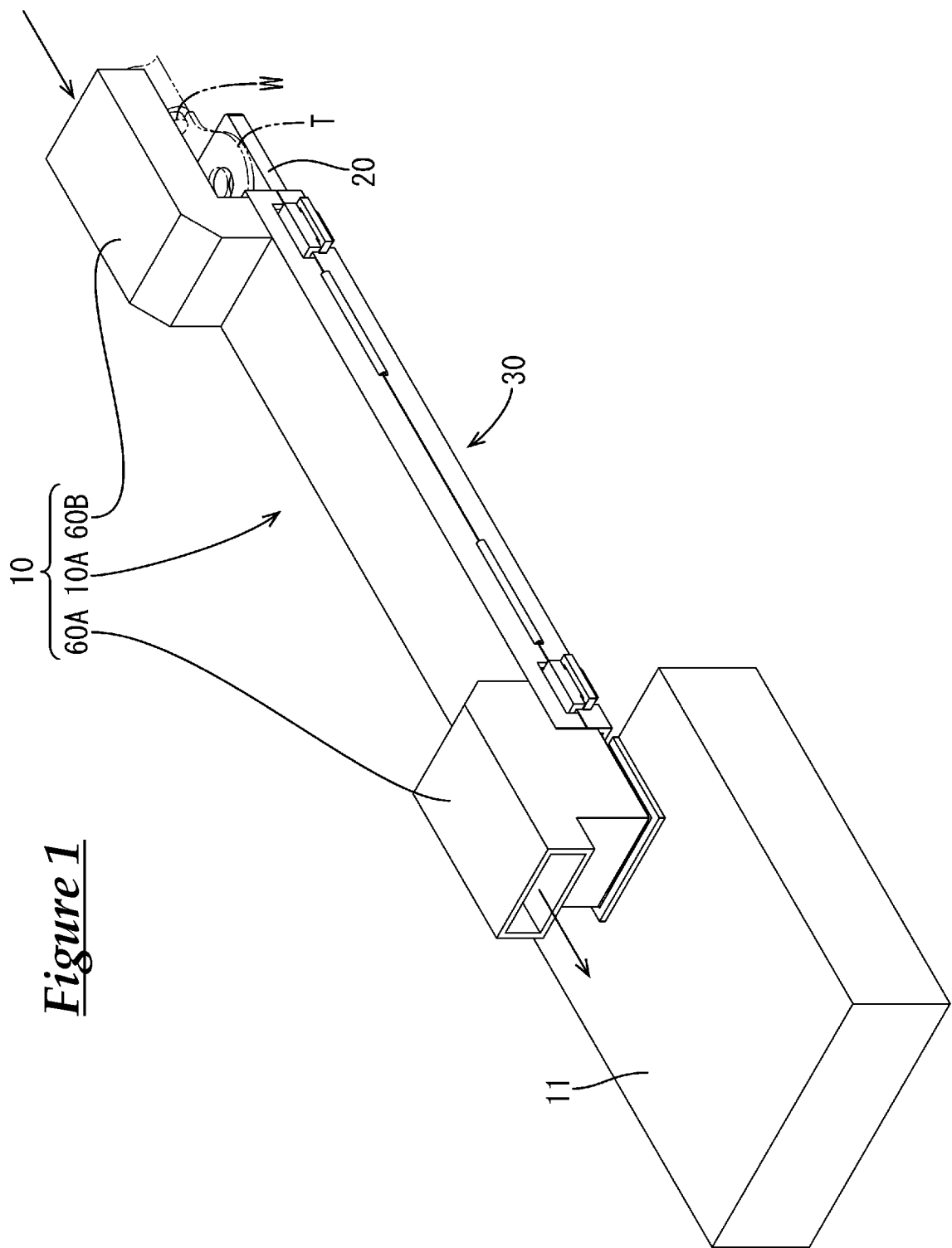
FIG. 1 is a perspective view showing a state in which a bus bar module of Embodiment 1 is attached to a device.

Embodiment 1 will be described with reference to FIGS. 1 to 20.

A bus bar module 10 according to Embodiment 1 can be used in a portion of a conductive path on a route, in a vehicle such as an electric automobile or a hybrid automobile, between a power supply, such as a battery, and a load constituted by an in-vehicle electrical component, such as a lamp or a wiper, or a motor or the like. In the present embodiment, an example in which the technology described in this specification is applied to the bus bar module 10 that connects a device 11 (in FIG. 1, only a portion of the device is shown, and the other portions are omitted) and a wire W to each other will be described.

Various devices 11 such as, for example, an inverter and a DC-DC converter, can be used as the device 11. The device 11 has a terminal 12 that can be connected to an external member (see FIG. 18). The terminal 12 is bolt-shaped (cylindrical), for example, and a bus bar 20 is connected to the terminal 12 through fastening with a nut 56, which constitutes a fastening member. The wire W is constituted by a conductor portion and an insulating coating that encloses the outer periphery of the conductor portion. The conductor portion may be a stranded wire constituted by thin strands of metal wire stranded together or may be a single-strand core wire. A terminal T is attached to an end portion of the wire W and connected to the bus bar 20. Although various terminals can be used as the terminal T, the terminal T may be a ring terminal, for example, and has a barrel portion for crimping to the conductor portion and a fastening portion that is formed of a plate-shaped piece of metal, that has a bolt hole penetrating the fastening portion, and that is fastened to the bus bar 20 as a result of the fastening portion and the bus bar 20 being jointly tightened with a fastening member constituted by a bolt and a nut.

Figure 2:
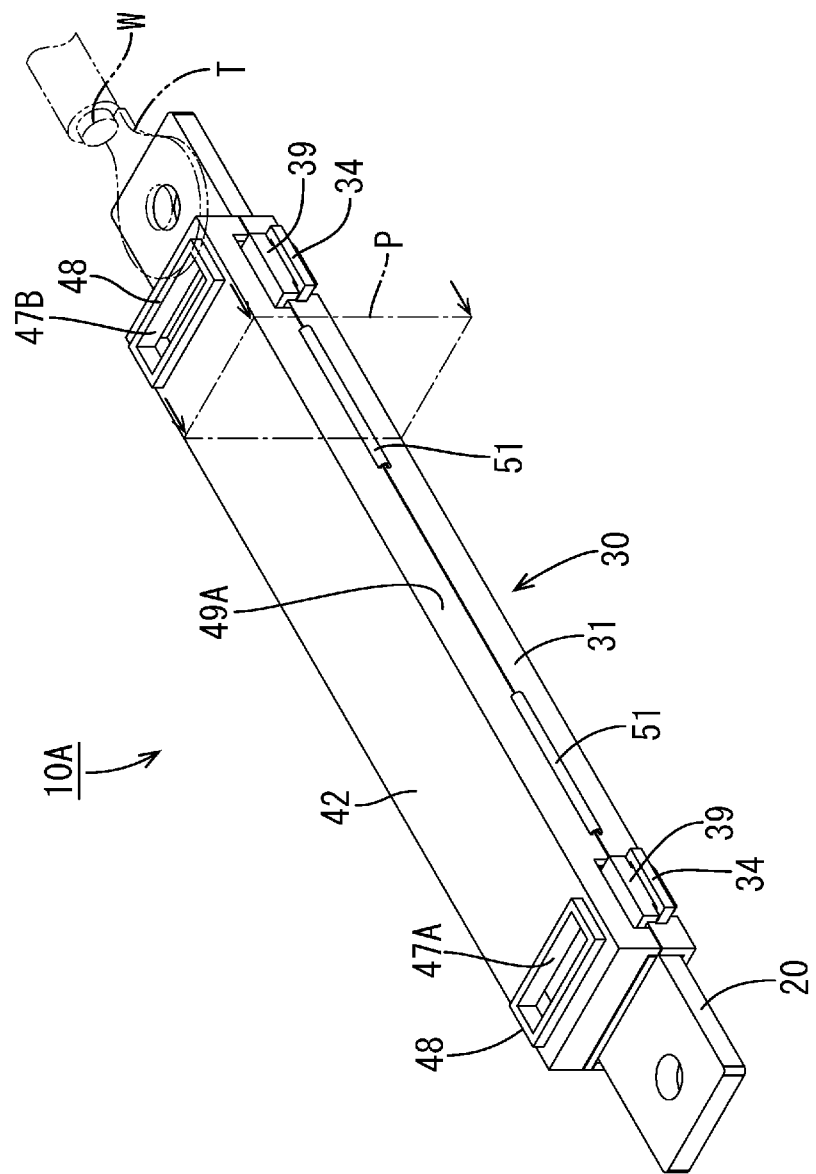
FIG. 2 is a perspective view showing a bus bar module main body.
Figure 3:
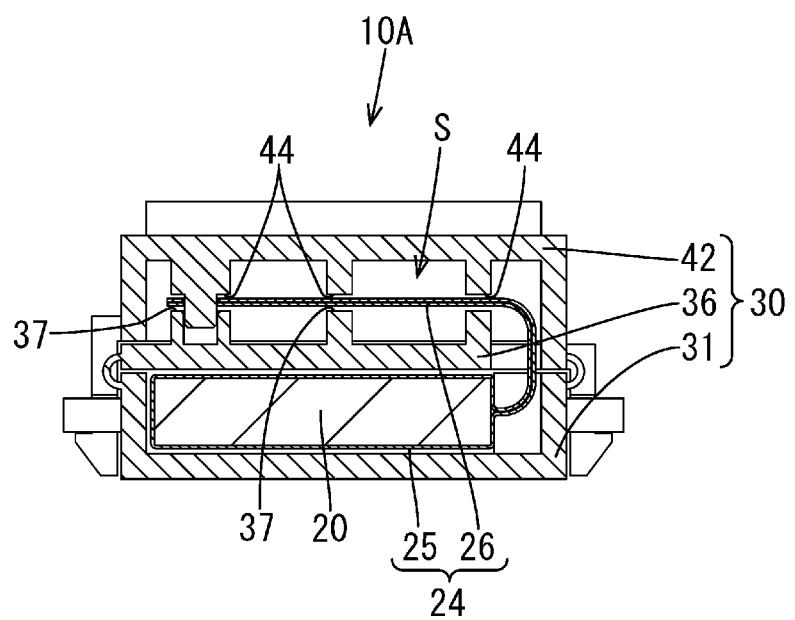
FIG. 3 is a cross-sectional view taken along plane P in FIG. 2.

As shown in FIG. 1, the bus bar module 10 includes a bus bar module main body 10A and a pair of ducts 60A and 60B. As shown in FIGS. 2 and 3, the bus bar module main body 10A includes the bus bar 20, a thermally conductive sheet 24 that is in close contact with the outer periphery of the bus bar 20, and an insulating case 30 that covers the bus bar 20 and the thermally conductive sheet 24.

Figure 6:
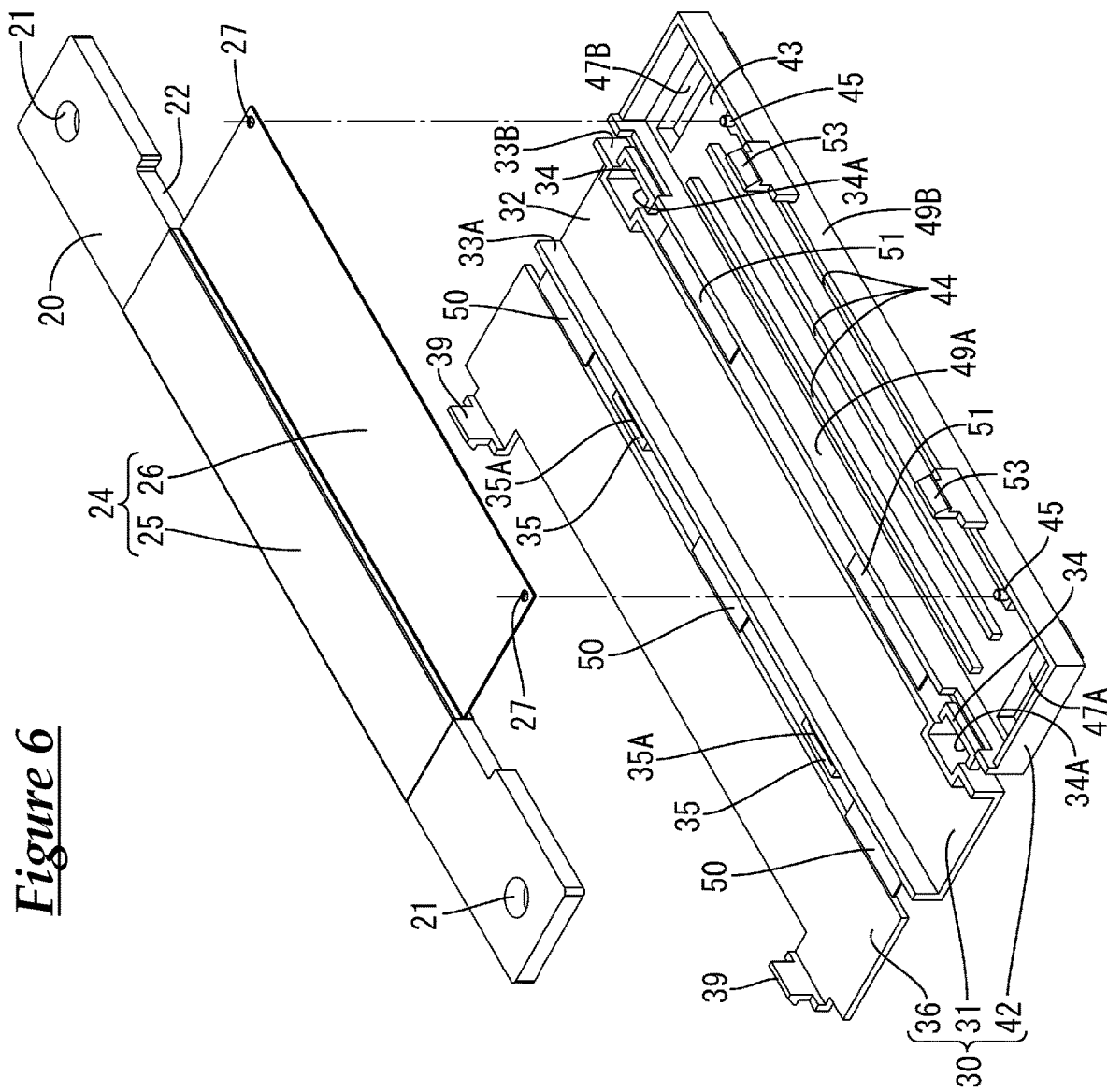
FIG. 6 is a perspective view for explaining how a bus bar with a thermally conductive sheet mounted thereto is mounted to a case.
Figure 7:
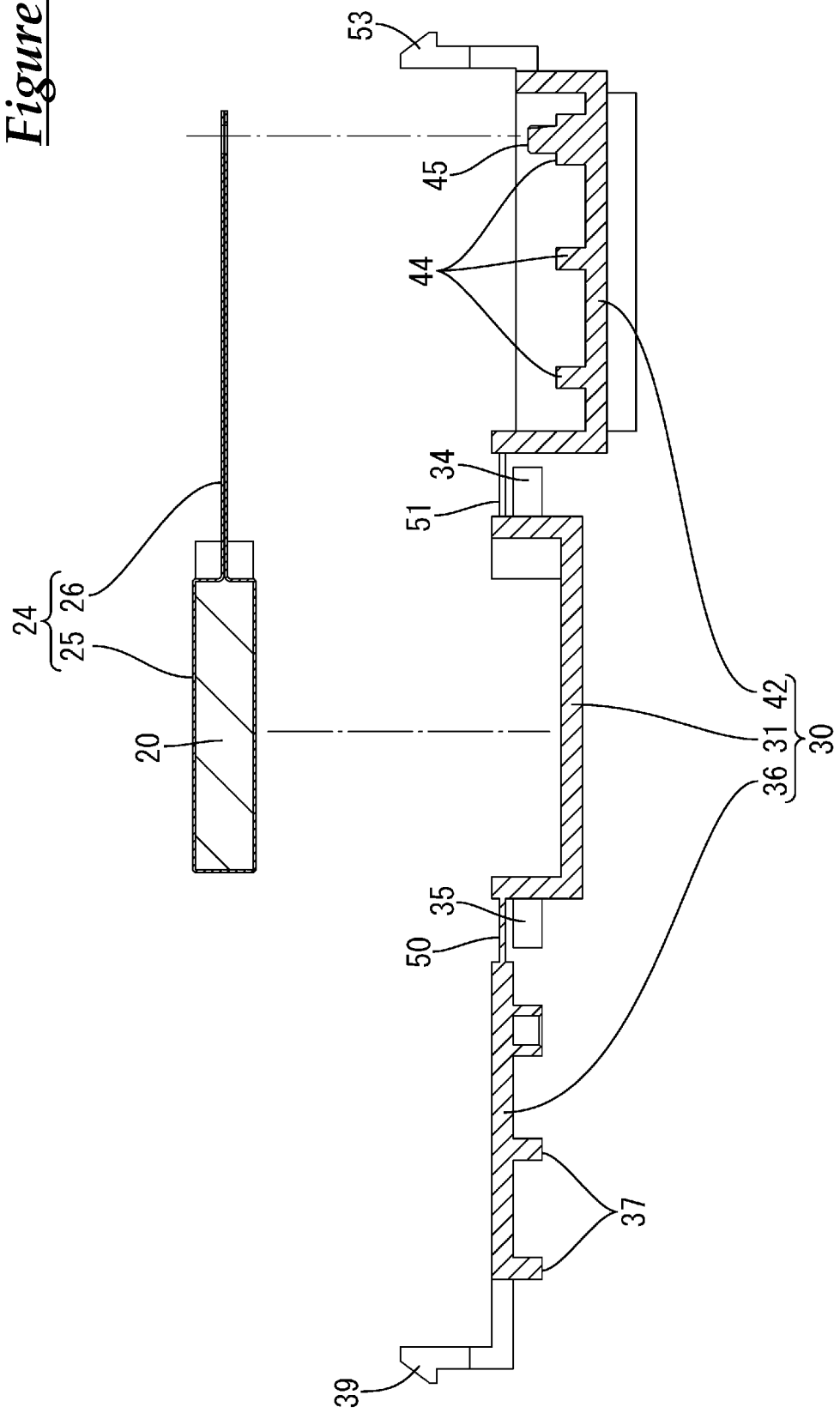
FIG. 7 is a cross-sectional view showing the state in FIG. 6.

As shown in FIG. 6, the bus bar 20 has a substantially rectangular plate-like shape (band-like shape), and circular insertion holes 21 into which the terminal 12 or a shank portion of a bolt, which is not shown, is inserted are formed at and penetrate both end portions of the bus bar 20 in the longitudinal direction. A cut-away portion 22 is formed in one of the side edge portions (side faces) of the bus bar 20 on the left and right sides relative to the longitudinal direction, the cut-away portion 22 having a shape formed by cutting away a portion of that side edge portion so as to reduce the width of the bus bar 20. The cut-away portion 22 is provided in the middle portion (portion excluding the both end portions) of the overall length of the bus bar 20 that corresponds to a position to which the thermally conductive sheet 24 is mounted. The bus bar 20 is made of any metal material, such as copper, a copper alloy, aluminum, an aluminum alloy, iron, or an iron alloy. A plating layer is formed on the surface of the bus bar 20, using any metal material, such as tin or nickel; however, the bus bar 20 is not necessarily required to have a plating layer.

The thermally conductive sheet 24 has an enclosing portion 25 that encloses the outer periphery of the bus bar 20 while being in close contact with the outer periphery of the bus bar 20, and an extension portion 26 that extends outward from the bus bar 20. The enclosing portion 25 encloses the entire periphery of a region having a predetermined length, of the bus bar 20, that is located in the middle portion of the bus bar 20 in the longitudinal direction, and the heat of the bus bar 20 is directly transferred to the enclosing portion 25. The extension portion 26 extends to a lateral side of the bus bar 20 relative to the longitudinal direction in a state in which two sheets are laid one on top of the other and joined together, and is disposed in a curved state such that it is folded back onto the bus bar 20 side within the case 30. A pair of circular positioning holes 27 are formed at and penetrate respective corner portions of the extension portion 26.

The thermally conductive sheet 24 is formed from a rectangular sheet with high thermal conductivity and a small thickness, by bending this sheet so as to enclose the bus bar 20 and superposing end portions of the sheet one on top of the other. An adhesive layer is formed on an inner surface side of the thermally conductive sheet 24 by applying an adhesive thereto. For example, a known adhesive made of a synthetic resin can be appropriately chosen as the adhesive. The thermally conductive sheet 24 may be made of a carbon material, or may be made of metal. The carbon material may be a type of graphite that contains graphene or a type of graphite that contains a carbon material different from graphene, or may be a carbon material different from graphite.

Moreover, if the thermally conductive sheet 24 is made of metal, any metal material, such as copper, a copper alloy, aluminum, an aluminum alloy, iron, an iron alloy, silver, or a silver alloy, for example, can be appropriately chosen as necessary. The thermal conductivity of the thermally conductive sheet 24 is preferably 90 W/m·K or more, more preferably 230 W/m·K or more, and even more preferably 420 W/m·K or more. For example, a heat dissipation sheet containing aluminum nitride having a thermal conductivity of 90 W/m·K to 230 W/m·K can be used as the thermally conductive sheet 24. Also, a sheet made of a metal having a thermal conductivity of 230 W/m·K to 420 W/m·K can be used as the thermally conductive sheet 24. Examples of the values of the thermal conductivity of metals include those of aluminum (237 W/m·K), gold (293 W/m·K), silver (419 W/m·K), and copper (398 W/m·K). Moreover, a graphite sheet having a thermal conductivity of 700 W/m·K to 1600 W/m·K can be used as the thermally conductive sheet 24.

The case 30 is made of an insulating synthetic resin, and includes a first case 31 in which the bus bar 20 in a state in which the enclosing portion 25 of the thermally conductive sheet 24 is in close contact with the outer periphery of the bus bar 20 is placed, a partition plate 36 (an example of a "partition portion") that is connected to a side wall 33A of the first case 31 on one side of the first case 31, and a second case 42 that is connected to a side wall 33B of the first case 31 on the other side of the first case 31.

The first case 31 includes a bottom plate 32 on which the bus bar 20 is placed and the pair of side walls 33A and 33B extending upward from opposite side edges of the bottom plate 32. Band-shaped hinge portions 50 and 51 that are formed to have such a thickness that allows flexural deformation are connected to outer surfaces of the pair of side walls 33A and 33B. The hinge portions 50 are integrally formed with the side wall 33A and the partition plate 36 so as to extend between the side wall 33A and the partition plate 36, and the hinge portions 51 are integrally formed with the side wall 33B and a side wall 49A of the second case 42 so as to extend between the side wall 33B and the side wall 49A.

Locked portions 34 to which locking portions 39 of the partition plate 36 are respectively locked are formed on the outer side of the side wall 33B, which is one of the side walls, and locked portions 35 to which locking portions 53 of the second case 42 are respectively locked are formed on the outer side of the side wall 33A, which is the other of the side walls. Locked holes 34A and 35A are formed penetrating the corresponding locked portions 34 and 35.

Figure 10:
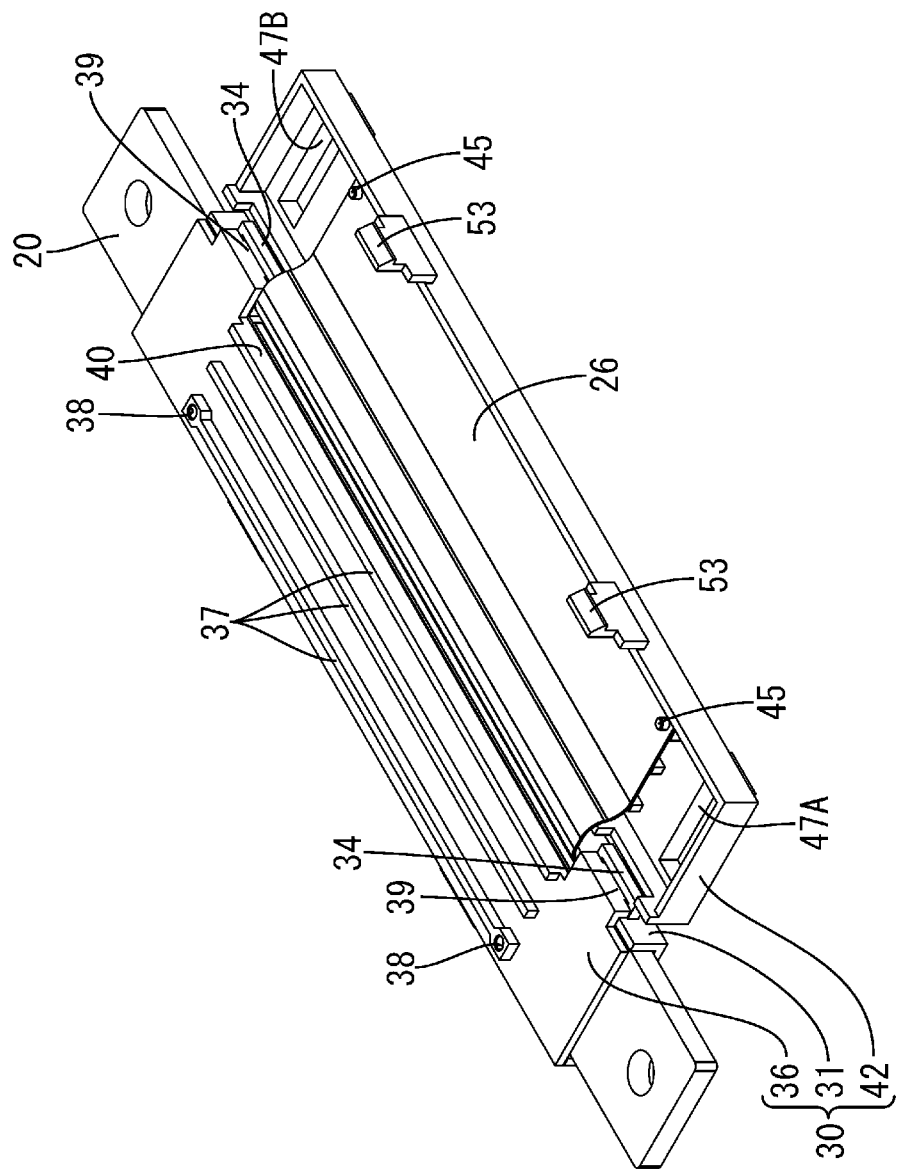
FIG. 10 is a perspective view showing a state in which the partition plate has been rotated from the state in FIG. 8, and locking portions are locked in locked portions of the first case.
Figure 11:
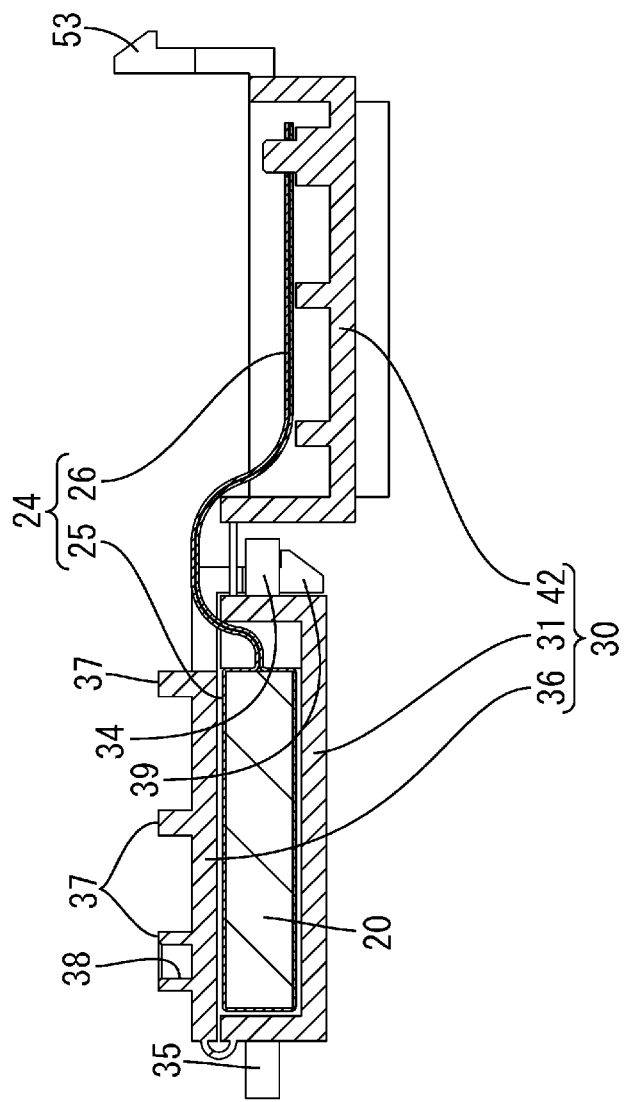
FIG. 11 is a cross-sectional view showing the state in FIG. 10.
Figure 12:
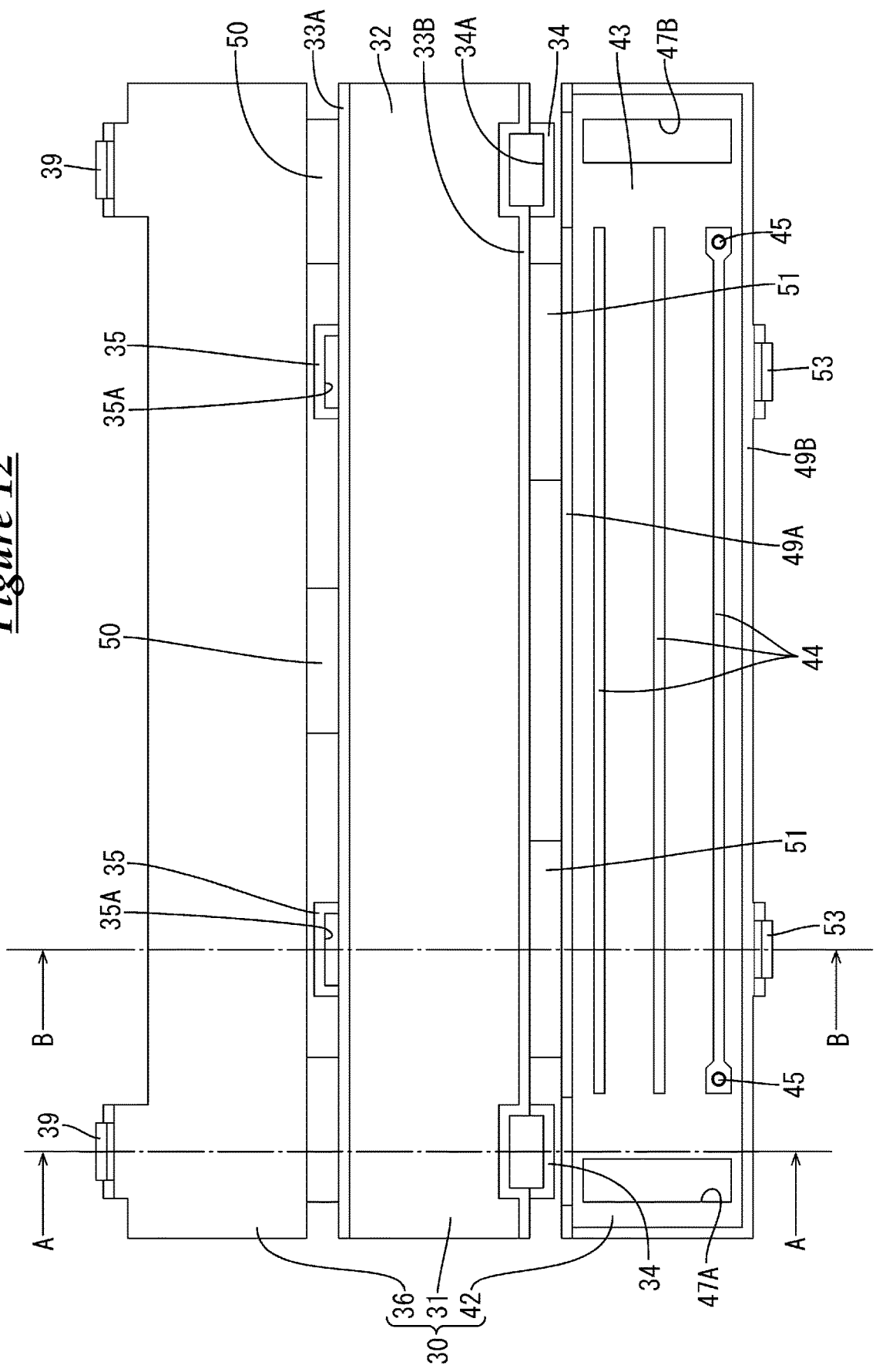
FIG. 12 is a plan view showing the case in an opened-out state.
Figure 13:
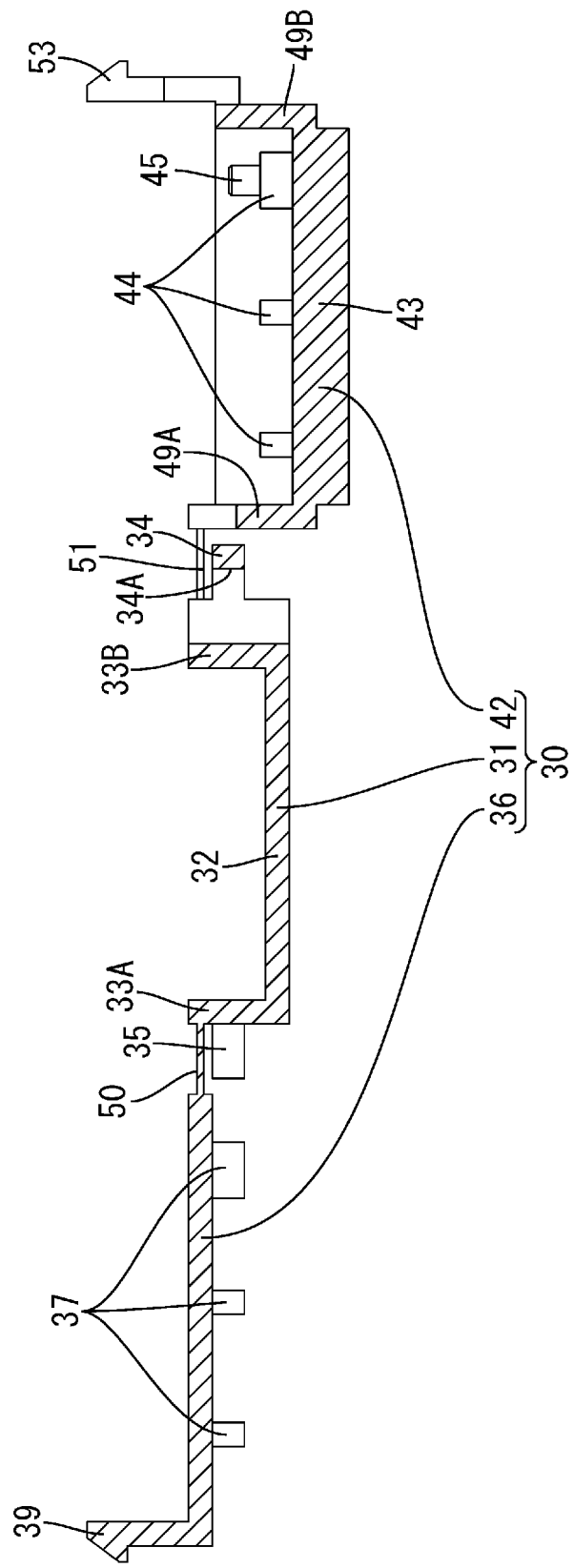
FIG. 13 is a cross-sectional view taken along line A-A in FIG. 12
Figure 14:
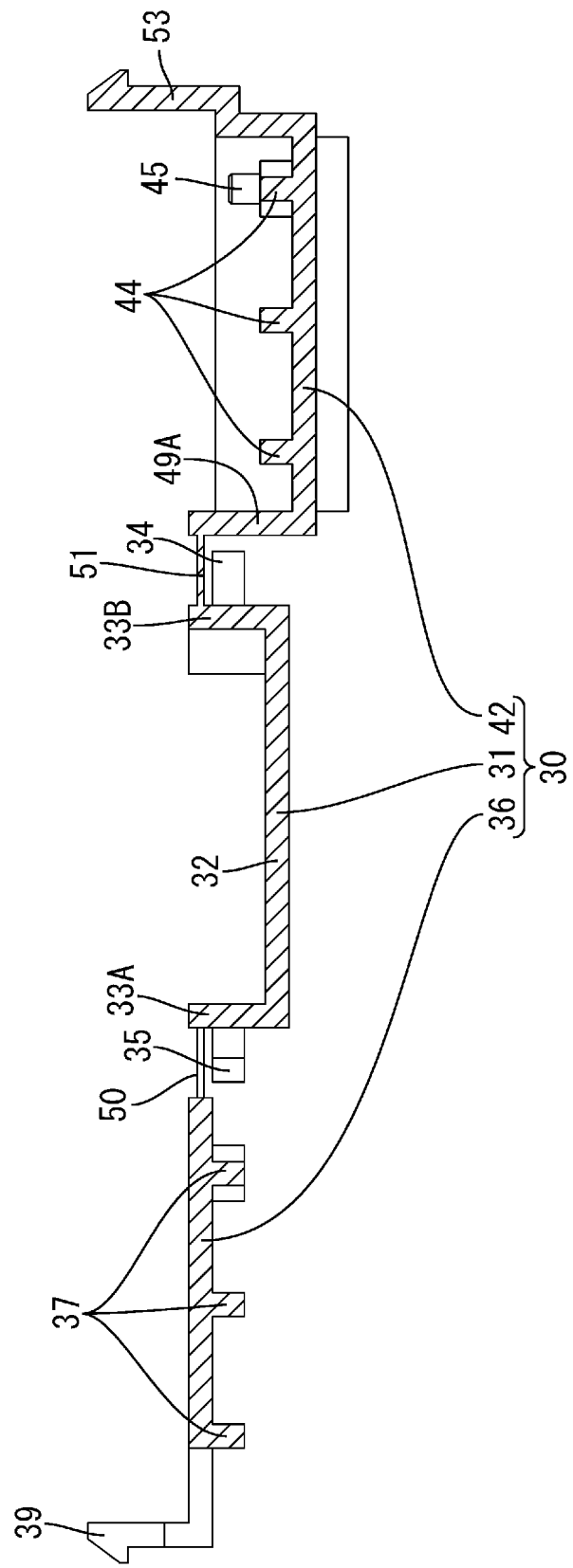
FIG. 14 is a cross-sectional view taken along line B-B in FIG. 12.
Figure 15:
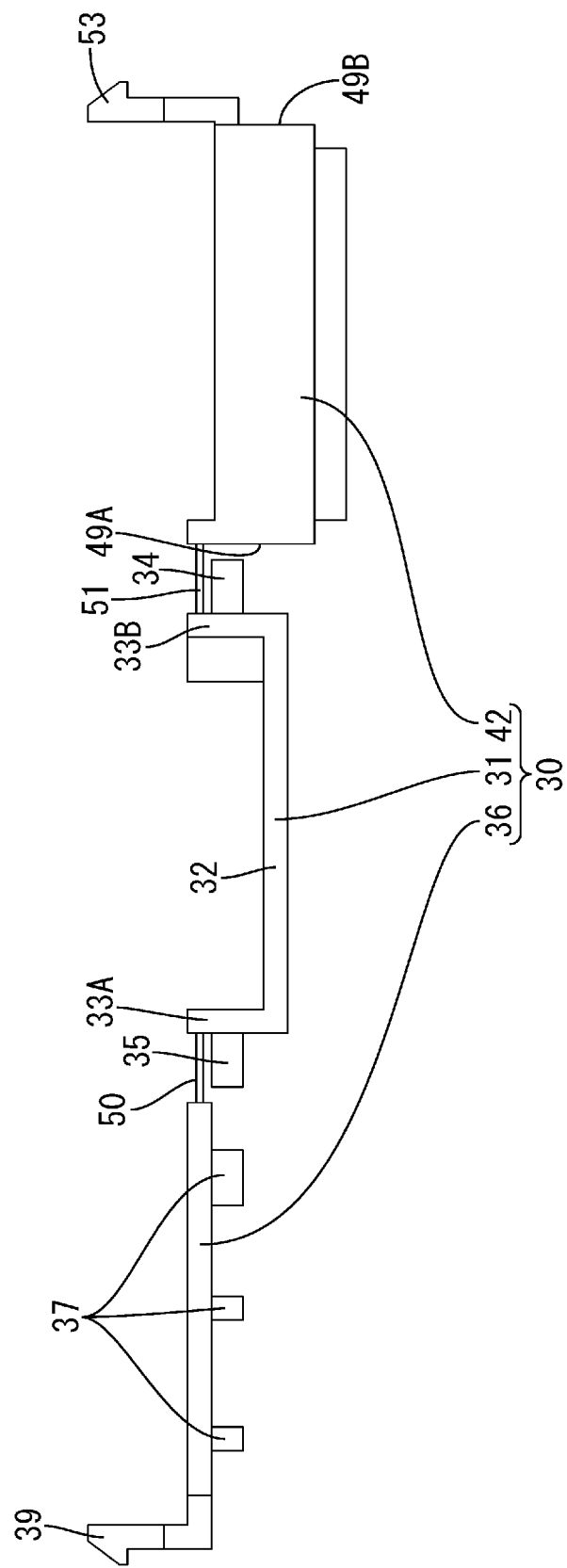
FIG. 15 is a front view showing the case in the opened-out state.
Figure 16:
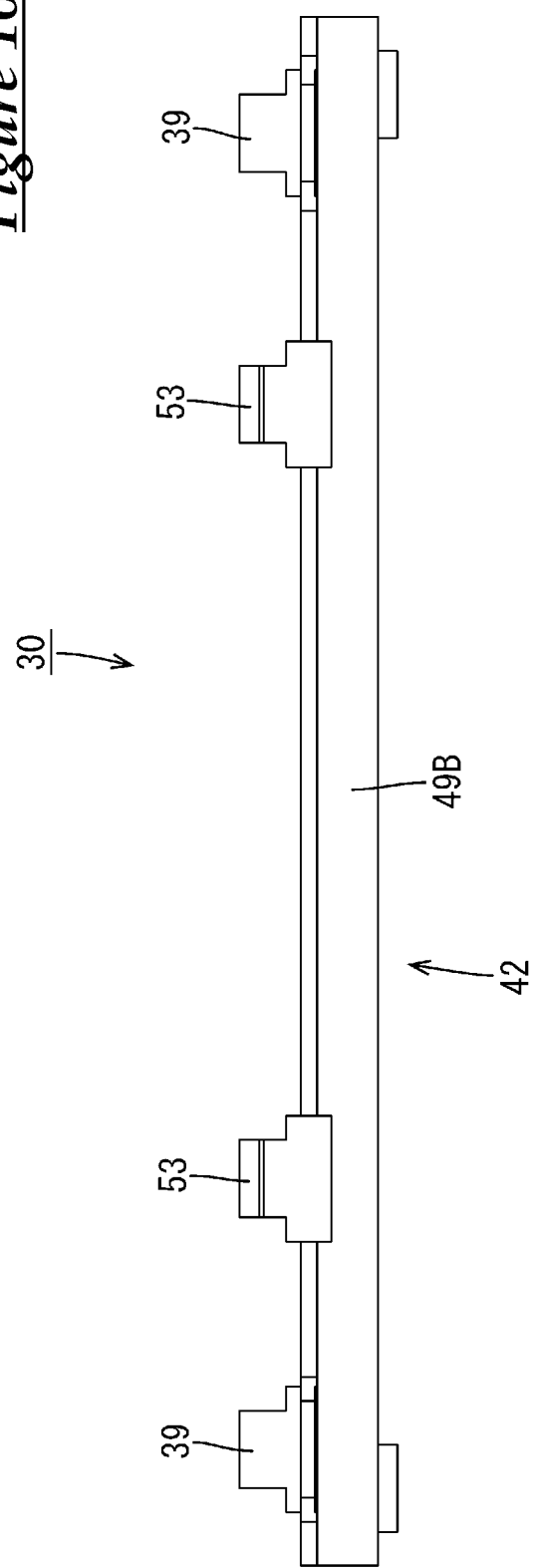
FIG. 16 is a side view showing the case in the opened-out state.
Figure 17:
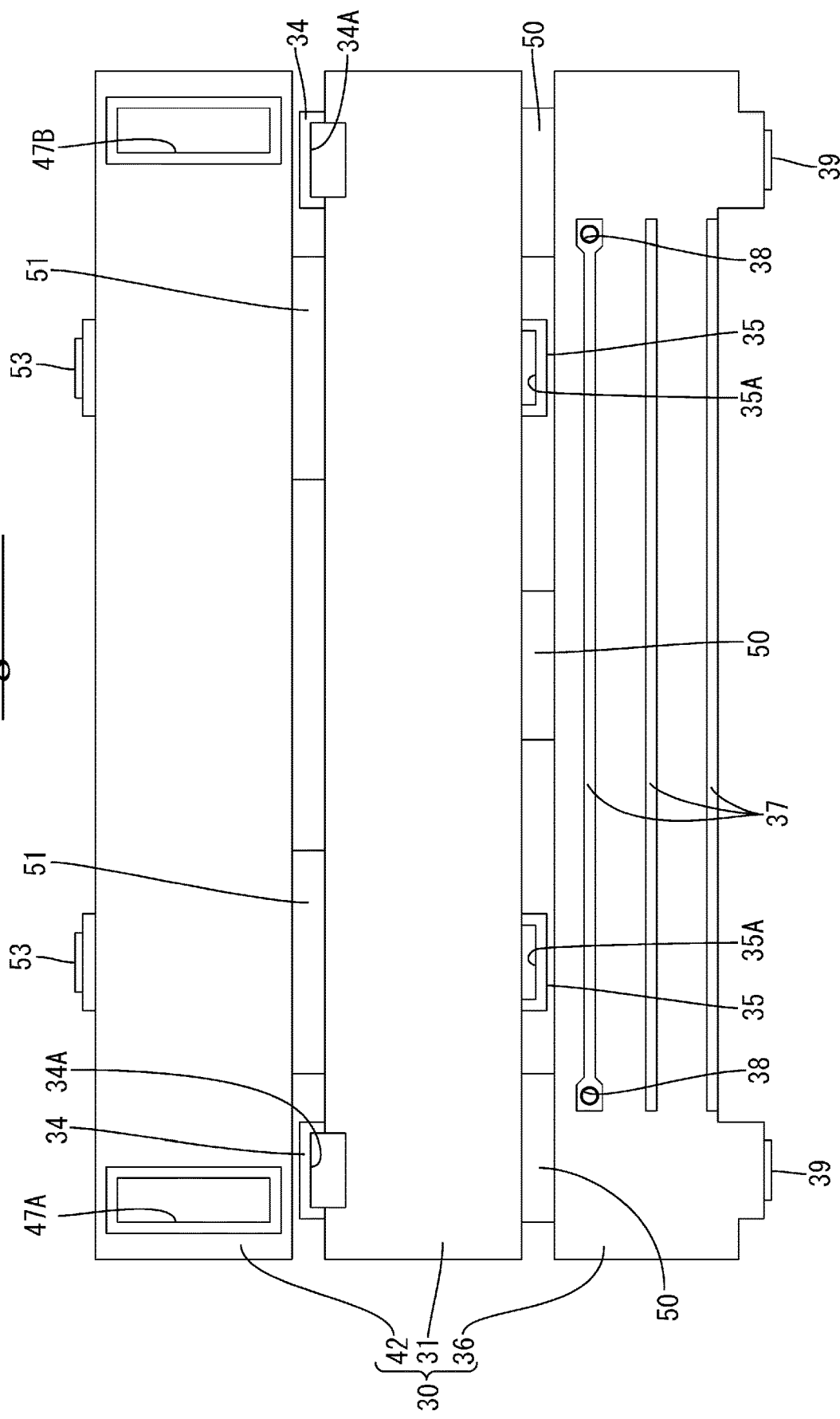
FIG. 17 is a bottom view showing the case in the opened-out state.

The partition plate 36 has a rectangular plate-like shape with a size corresponding to that of the bottom plate 32. The hinge portions 50 are connected to one of the side edges of the partition plate 36, and the locking portions 39 extend from the other side edge of the partition plate 36 in a direction that is orthogonal to the plate surface of the partition plate 36. In each of the locking portions 39, a locking claw to be locked to a hole edge portion of a corresponding one of the locked holes 34A is formed at a leading end portion of a flexible piece that is capable of flexural deformation. As shown in FIG. 10, a plurality of (three, in the present embodiment) retaining ribs 37 extending in the longitudinal direction (connecting direction of the bus bar 20) are provided protruding from one face (face that is located on the far side from the bus bar 20 in a state in which the partition plate 36 covers the bus bar 20) of the partition plate 36. Positioning recesses 38 in which positioning pins 45 for positioning the extension portion 26 are respectively fitted are formed at both end portions of one of the retaining ribs 37. The other face (face that opposes the bus bar 20 in the state in which the partition plate 36 covers the bus bar 20) of the partition plate 36 constitutes a flat surface. When the partition plate 36 is mounted on the bus bar 20 that is placed in the first case 31, the bus bar 20 is sandwiched between the partition plate 36 and the first case 31, and thus, the bus bar 20 is held in position.

As shown in FIG. 6, the second case 42 includes a plate-shaped portion 43 that has a rectangular shape corresponding to the shapes of the bottom plate 32 and the partition plate 36 and that covers the extension portion 26 and the partition plate 36, and a pair of side walls 49A and 49B extending upward from opposite side edges of the plate-shaped portion 43. A plurality of (three, in the present embodiment) retaining ribs 44 extending in the longitudinal direction are provided protruding from one face (face that opposes the partition plate 36 and the extension portion 26 in a state in which the second case 42 is mounted on the partition plate 36 and the extension portion 26; upper face side in FIG. 6) of the plate-shaped portion 43. The positioning pins 45, which are to be inserted into the respective positioning holes 27 of the thermally conductive sheet 24, protrude from both end portions of one of the retaining ribs 44. In a state in which the positioning pins 45 penetrate the respective positioning holes 27, the positioning pins 45 fit into the respective positioning recesses 38 of the partition plate 36. The other face (face on the opposite side to the face that opposes the partition plate 36 and the extension portion 26 in the state in which the second case 42 is mounted on the partition plate 36 and the extension portion 26; lower face side in FIG. 6) of the plate-shaped portion 43 has a substantially flat shape.

Through holes 47A and 47B are formed penetrating the plate-shaped portion 43, on respective end portion sides of the plate-shaped portion 43 in the longitudinal direction. The through holes 47A and 47B have a rectangular shape that is long in the width direction of the plate-shaped portion 43, and are provided in regions where the extension portion 26 is not disposed (regions, of the overall length of the second case 42 in the longitudinal direction, where the retaining ribs 44 are not formed). As shown in FIG. 2, rectangular fitting protruding portions 48 to which the ducts 60A and 60B are to be respectively fitted are provided on an outer surface (the other face) of the plate-shaped portion 43 at positions adjacent to the outer side of the respective through holes 47A and 47B. As shown in FIG. 6, the hinge portions 51 are connected to the side wall 49A, which is one of the side walls of the second case 42, and the locking portions 53 extend from the other side wall 49B in a direction that is orthogonal to the plate surface of the partition plate 36. In each of the locking portions 53, a locking claw to be locked to a hole edge portion of a corresponding one of the locked holes 35A is formed at a leading end portion of a flexible piece that is capable of flexural deformation.

When the second case 42 is disposed on the upper side of the partition plate 36 so as to oppose the partition plate 36, an accommodation space S in which the extension portion 26 is accommodated is formed between the partition plate 36 and the second case 42 as shown in FIG. 3. The extension portion 26 is sandwiched between the retaining ribs 37 and 44 within the accommodation space S and is thus held in a state in which displacement of the extension portion 26 is restricted. Note that since the inside of the accommodation space S is filled with air, the heat of the extension portion 26 is transferred to the air within the accommodation space S.

Figure 4:
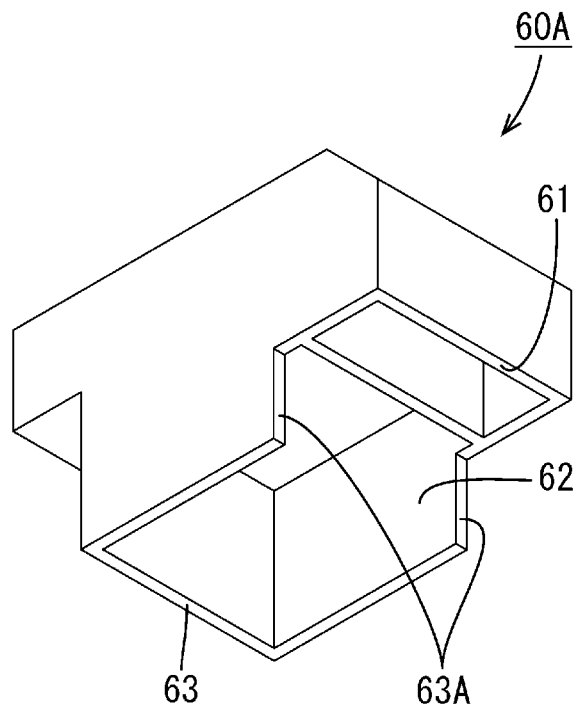
FIG. 4 is a perspective view showing one duct.
Figure 5:
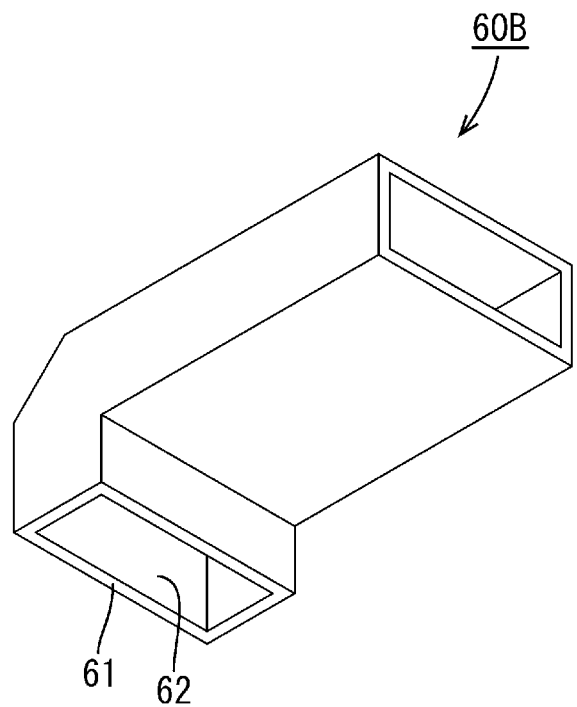
FIG. 5 is a perspective view showing another duct.

The pair of ducts 60A and 60B are made of metal or a synthetic resin, for example, and, as shown in FIGS. 4 and 5, have opening portions 61 to be fitted to the respective fitting protruding portions 48 of the second case 42 and vent holes 62 to be in communication with the respective through holes 47A and 47B. The vent holes 62 each extend in an L-shape, and cool air supplied from a direction (direction of arrows in FIG. 1) along the longitudinal direction of the bus bar module 10 is introduced into the case 30 via the through hole 47B and discharged from the case 30 via the through hole 47A. Cool air can be supplied from, for example, an air conditioner, a cooling fan, or the like.

The duct 60A, which is one of the ducts, has a hood portion 63 to be mounted to an end portion side of the bus bar 20. The hood portion 63 is configured to cover the end portion side of the bus bar 20 that is exposed from the case 30, and is formed in a shape that conforms to an edge portion of the bus bar 20. An end portion 63A of the hood portion 63 on the case 30 side is disposed so as to oppose an edge portion of an end face of the case 30, and covers the end face of the case 30.

Next, a method for manufacturing the bus bar module 10 will be described.

Figure 8:
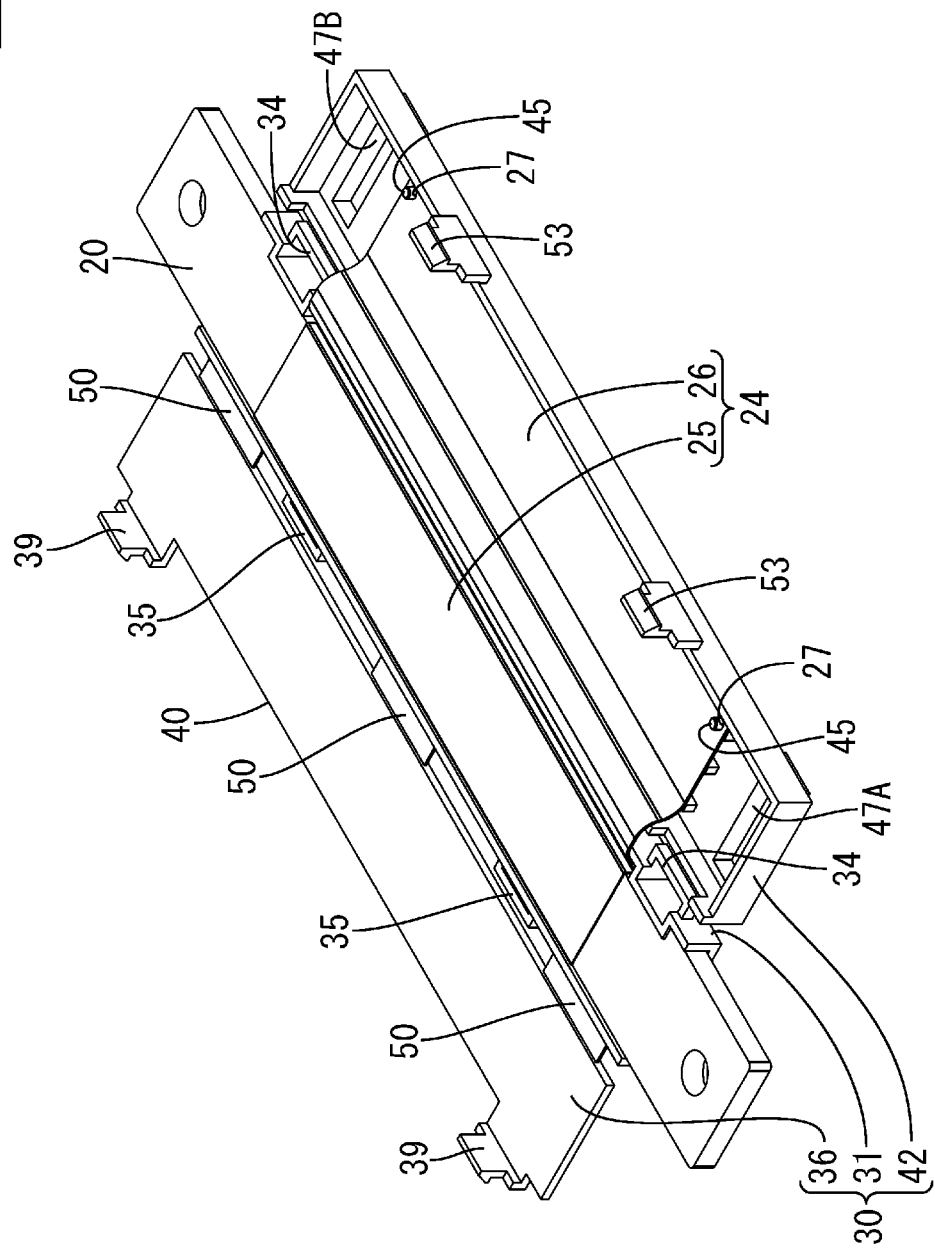
FIG. 8 is a perspective view showing a state in which the bus bar with the thermally conductive sheet mounted thereto is placed in a first case.
Figure 9:
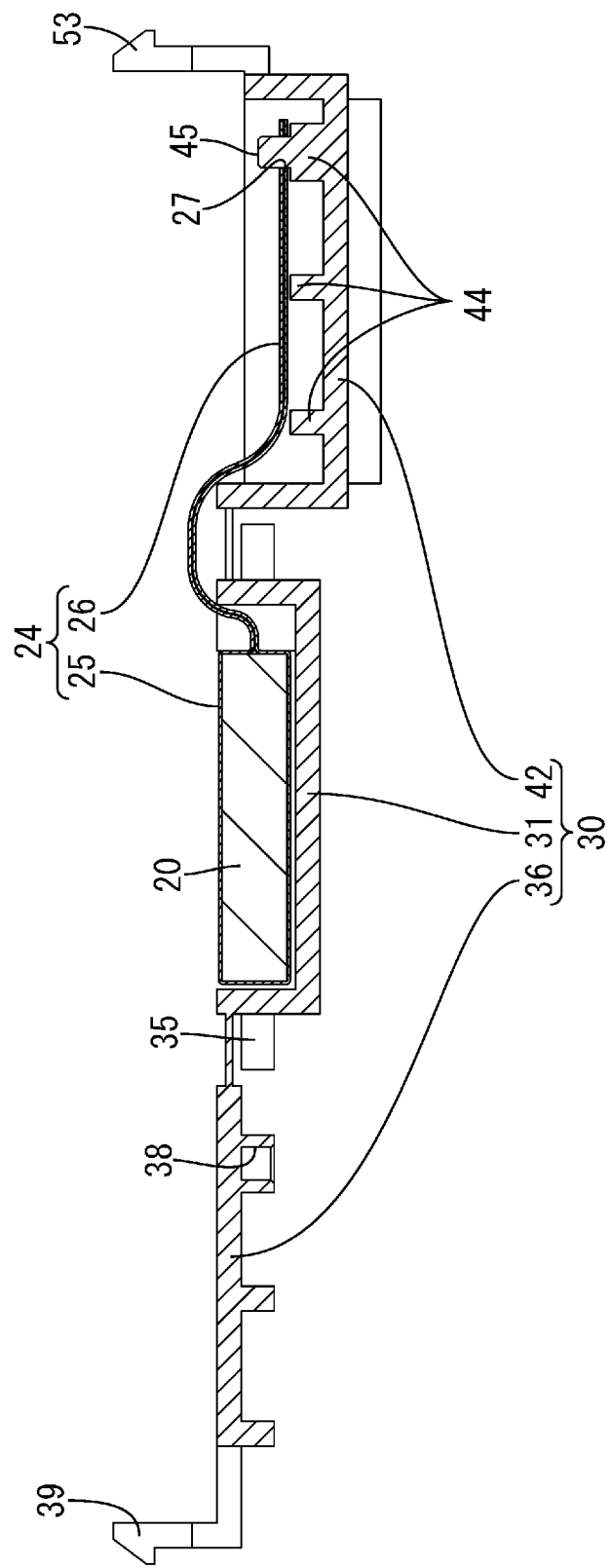
FIG. 9 is a cross-sectional view showing the state in FIG. 8.

A metal plate material is punched with a press to form the bus bar 20. The thermally conductive sheet 24 on one surface of which an adhesive is applied is wrapped around the outer periphery of the bus bar 20, and the end portion sides of the thermally conductive sheet 24 are joined together to form the extension portion 26 (FIG. 6). Then, the partition plate 36 and the second case 42 of the case 30 are opened out relative to the first case 31, and in this state, the bus bar 20 with the thermally conductive sheet 24 mounted thereto is mounted in the first case 31. Moreover, the extension portion 26 is placed on the retaining ribs 44 while the positioning pins 45 of the second case 42 are inserted into the respective positioning holes 27 of the extension portion 26 (FIG. 8).

Figure 18:
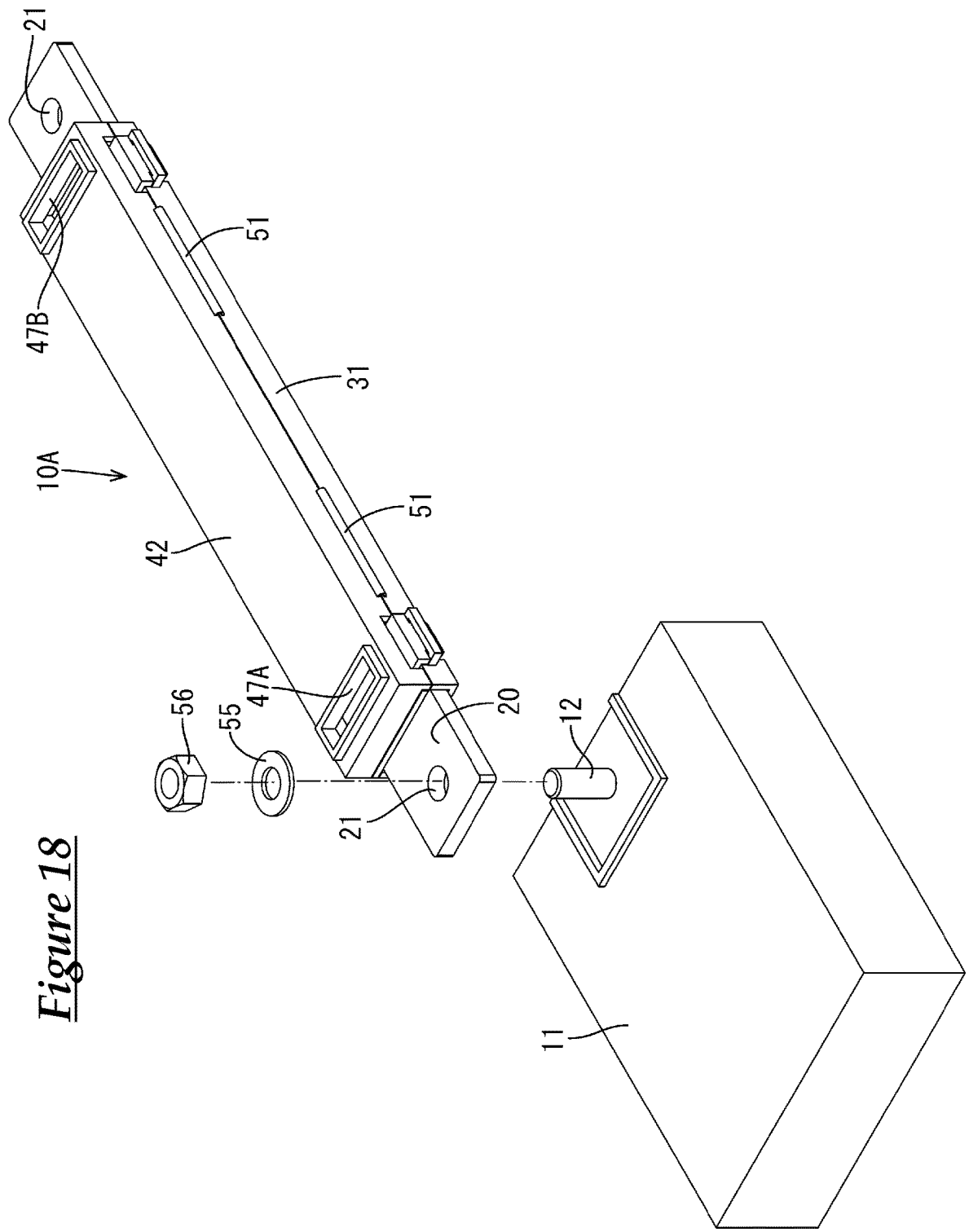
FIG. 18 is a perspective view for explaining how the bus bar module main body is mounted to the device.
Figure 19:
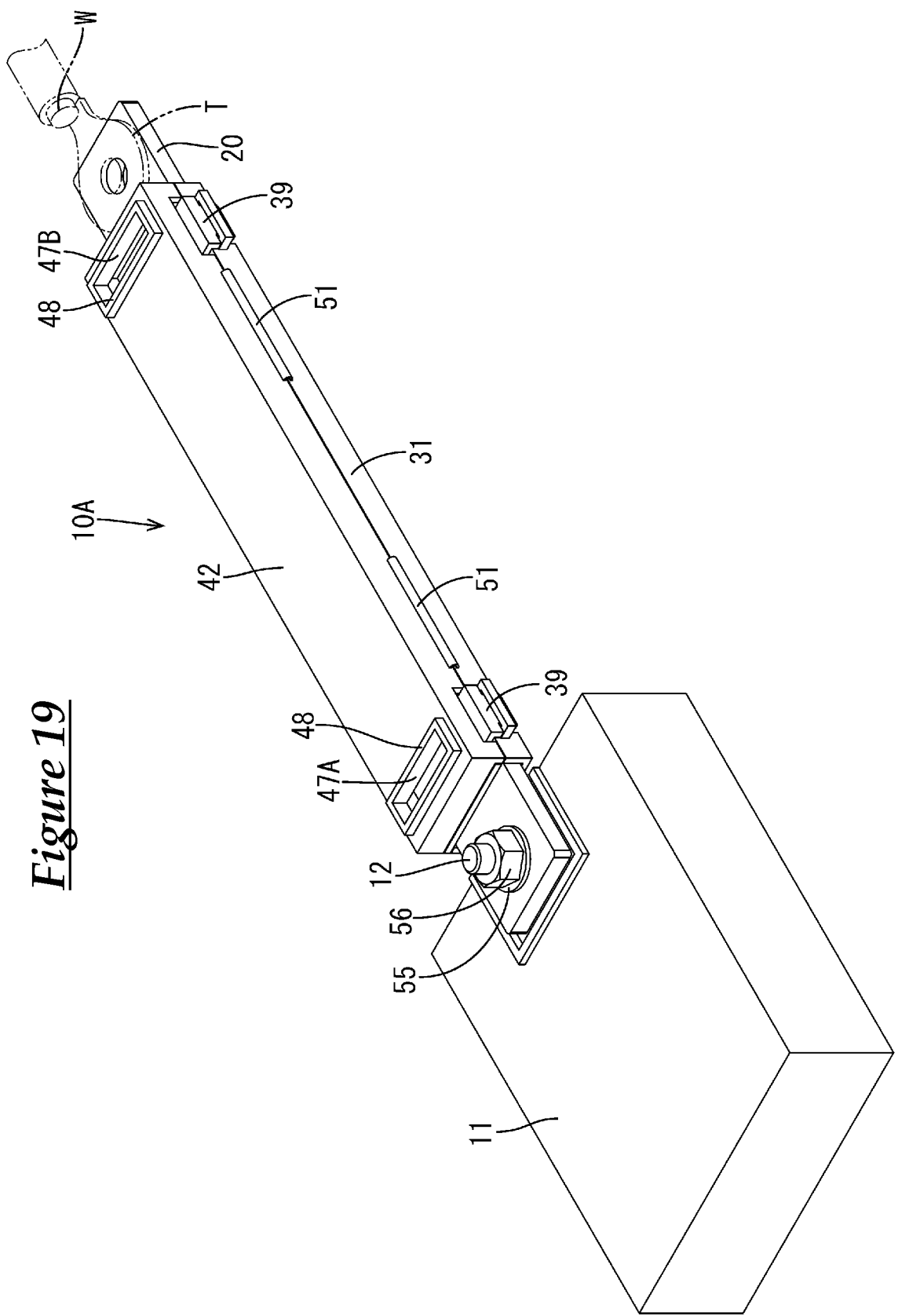
FIG. 19 is a perspective view showing a state in which the bus bar module main body has been mounted to the device.

Next, the partition plate 36 is rotated toward the bus bar 20 via the hinge portions 50, and the locking portions 39 are locked to the locked portions 34 (FIG. 10). At this time, the thermally conductive sheet 24 is passed through the cutaway portion 40 of the partition plate 36 between the pair of locking portions 39. Then, the second case 42 is rotated toward the partition plate 36 via the hinge portions 51, the locking portions 53 are locked to the locked portions 35, and thus, the bus bar module main body 10A is formed (FIG. 2). When the bus bar module main body 10A in this state is obtained, as shown in FIG. 18, an insertion hole of a washer 55 is aligned with the insertion hole 21 at one end portion of the bus bar 20 in the longitudinal direction, the terminal 12 of the device 11 is inserted into the insertion holes, and fastening with a nut 56 is performed. Moreover, for example, the other end portion of the bus bar 20 is fastened to the terminal T at the end portion of the wire W with a fastening member (FIG. 19). Then, as shown in FIG. 20, the ducts 60A and 60B are attached to the bus bar 20 and the case 30 using an adhesive or the like. Thus, the bus bar module 10 connected to the terminal 12 of the device 11 is formed (FIG. 1).

According to the present embodiment, the following effects are obtained.

The bus bar module 10 includes the bus bar 20, which is formed of a plate-shaped piece of metal, the thermally conductive sheet 24, which is in close contact with the outer periphery of the bus bar 20 and has the extension portion 26 extending outward from the bus bar 20, and the insulating case 30, which covers the bus bar 20 and the thermally conductive sheet 24. The accommodation space S, in which the extension portion 26 is accommodated with a gap left between the extension portion 26 and the bus bar 20, is provided between the bus bar 20 and the case 30. The through holes 47A and 47B through which the accommodation space S is in communication with an external space is formed penetrating the case 30.

According to the present embodiment, the heat that is generated when the bus bar 20 is energized is transferred to the thermally conductive sheet 24, which is in close contact with the outer periphery of the bus bar 20. The heat that has been transferred to the thermally conductive sheet 24 is transferred to the air within the accommodation space S from the extension portion 26, and the temperature of the air within the accommodation space S increases. The heat of the air within the accommodation space S is transferred to air in the external space via the through holes 47A and 47B, and the temperature of the air within the accommodation space S decreases. Thus, the heat of the bus bar 20 can be dissipated without accumulating within the case 30, and the heat dissipation properties of the bus bar module 10 can therefore be improved.

Moreover, the case 30 includes the partition plate 36 (partition portion), which separates the bus bar 20 and the extension portion 26 from each other.

With this configuration, displacement of the bus bar 20 can be suppressed by the partition plate 36.

Moreover, the through holes 47A and 47B are provided in the regions of the case 30 that are different from the region of the case 30 that covers the extension portion 26.

With this configuration, a worker or the like can be kept from touching the extension portion 26 from the through hole 47A or 47B.

Moreover, the bus bar module 10 includes the ducts 60A and 60B, in which the vent holes 62 that are in communication with the respective through holes 47A and 47B are formed. The insertion holes 21, into which a shank portion of a bolt (fastening member) or the bolt-shaped terminal 12 can be inserted, are formed penetrating the bus bar 20, and the duct 60A is attached so as to cover the bolt or the terminal 12.

With this configuration, it is possible to make it less likely that a worker or the like will touch a portion where the bus bar 20 is fastened, using the duct 60A provided for heat dissipation.

OTHER EMBODIMENTS

The technology described in this specification is not limited to the embodiment that has been described above with reference to the drawings, and embodiments such as those described below, for example, are also included in the technical scope of the technology described in this specification.

In the foregoing embodiment, the thermally conductive sheet 24 is in close contact with the bus bar 20 via the adhesive layer. However, the technology described in this specification is not limited to this configuration. For example, if the thermally conductive sheet 24 is made of metal, the thermally conductive sheet 24 and the bus bar 20 may be brought into close contact with each other through welding. Moreover, if the thermally conductive sheet 24 is made of a synthetic resin, the thermally conductive sheet 24 and the bus bar 20 may be brought into close contact with each other through heat sealing.

The use of the bus bar module 10 is not limited to the connection between the wire W and the device 11 described in the foregoing embodiment, and can be used for connection of other conductive paths. For example, the bus bar module 10 can be used for various types of connection such as connection between electrode terminals of a power storage element such as a battery, connection between an electrode terminal of a plurality of power storage elements that are connected in series and an external member, connection to a relay terminal for connecting to a conductive path constituted by another bus bar or the like, connection between devices 11, and connection between wires W.

The through holes 47A and 47B are provided in the regions of the case 30 that are different from the region of the case 30 that covers the extension portion 26; however, the technology described in this specification is not limited to this configuration. A configuration may also be adopted in which the through holes 47A and 47B are provided in the region of the case 30 that covers the extension portion 26.

The shape and the number of the through holes 47A and 47B are not limited to the shape and the number described in the foregoing embodiment, and can be changed as appropriate.

The shape of the partition plate 36 is not limited to the shape described in the foregoing embodiment, and various shapes can be adopted. For example, the partition plate 36 may have a shape other than a plate-like shape. Moreover, although a configuration in which the case 30 includes the partition plate 36 has been described, it is not necessarily required that the case 30 include the partition plate 36.

In the foregoing embodiment, the bus bar module 10 includes the ducts 60A and 60B. However, the technology described in this specification is not limited to this configuration, and a bus bar module without the ducts 60A and 60B is also conceivable.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

LIST OF REFERENCE NUMERALS

10: Bus bar module
20: Bus bar
24: Thermally conductive sheet
25: Enclosing portion
26: Extension portion
30: Case
31: First case
36: Partition plate (Partition portion)
37, 44: Retaining rib
42: Second case
47A, 47B: Through hole
60A, 60B: Duct
62: Vent hole
S: Accommodation space

The invention claimed is:

1. A bus bar module comprising:
 a bus bar that is formed of a plate-shaped piece of metal;
 a thermally conductive sheet that is in close contact with an outer periphery of the bus bar and that has an extension portion extending outward from the bus bar; and
 an insulating case that covers the bus bar and the thermally conductive sheet,
 wherein an accommodation space in which the extension portion is accommodated with a gap left between the extension portion and the bus bar is provided between the bus bar and the case, and
 a through hole through which the accommodation space is in communication with an external space is formed penetrating the case.

2. The bus bar module according to claim 1, wherein the case includes a partition portion that separates the bus bar and the extension portion from each other.

3. The bus bar module according to claim 2, wherein the through hole is provided in a region of the case that is different from a region of the case that covers the extension portion.

4. The bus bar module according to claim 1, further comprising:
 a duct in which a vent hole that is in communication with the through hole is formed,
 wherein an insertion hole into which a shank portion of a bolt or a bolt-shaped terminal can be inserted is formed penetrating the bus bar, and
 the duct is attached so as to cover the bolt or the terminal.

* * * * *